(12) United States Patent
Ho

(10) Patent No.: US 8,482,254 B2
(45) Date of Patent: Jul. 9, 2013

(54) BATTERY CAPACITY ESTIMATION BY DCIR

(75) Inventor: Chang-Yu Ho, Hsinchu County (TW)

(73) Assignee: Neotec Semiconductor Ltd., Hsin-Chu Hsien (TW)

( * ) Notice: Subject to any disclaimer, the term of this patent is extended or adjusted under 35 U.S.C. 154(b) by 462 days.

(21) Appl. No.: 12/853,333

(22) Filed: Aug. 10, 2010

(65) Prior Publication Data

US 2011/0037475 A1 Feb. 17, 2011

(30) Foreign Application Priority Data

Aug. 13, 2009 (TW) .............................. 98127249 A

(51) Int. Cl.
*H02J 7/00* (2006.01)

(52) U.S. Cl.
USPC .......................................... 320/132; 324/427

(58) Field of Classification Search
USPC .......................................... 320/132; 324/427
See application file for complete search history.

(56) References Cited

U.S. PATENT DOCUMENTS

| | | | |
|---|---|---|---|
| 6,789,026 B2 * | 9/2004 | Barsoukov et al. | 702/63 |
| 6,832,171 B2 * | 12/2004 | Barsoukov et al. | 702/65 |
| 2004/0220758 A1 * | 11/2004 | Barsoukov et al. | 702/63 |

* cited by examiner

*Primary Examiner* — Samuel Berhanu
(74) *Attorney, Agent, or Firm* — McClure, Qualey & Rodack, LLP

(57) ABSTRACT

A method of battery capacity measurement is actualized by battery internal resistance. This method establishes a controlled discharge path inside the battery module. The battery discharge current is a constant value despite of the variation of system loading current. The internal resistance measured by establishing this constant battery current can be used to obtain the battery capacity precisely.

6 Claims, 6 Drawing Sheets

BATTERY CAPACITY ESTIMATION BY DCIR

This application claims the benefit of Taiwan Application Serial No. 98127249, filed Aug. 13, 2009, the subject matter of which is incorporated herein by reference.

BACKGROUND OF THE INVENTION (1) Field of the Invention

The present invention relates to a battery capacity measurements, and more particularly to the battery capacity measurements by battery internal resistance of a constant discharge circuit.

(2) Description of the Prior Art

The battery may be the power source for all portable electronic devices. For example, mobile phones, laptop computers, personal digital assistants, music players, etc. They are all depends on battery power. Portable electronic devices nowadays adopt rechargeable batteries to recover the power loss consumed by the portable electronic devices.

The aging of the rechargeable battery is most commonly detected by the internal resistance changes of the battery. The internal resistance of the rechargeable battery is small just when the rechargeable battery was produced from a factory. But after a long period time of charging and discharging of the battery, the internal resistance gradually increased until that the resistance is too large for the battery to deliver power to electronic device. Most of the aging of the battery are caused by the increase of the internal resistance.

A rechargeable battery with excellent charge and discharge management can repeatedly be used for hundreds of times, even for thousands of times before aging.

The application of rechargeable Li-ion battery is ubiquitous in recent years. Although the Li-ion battery has many advantages, all the Li-ion battery has a property that the battery will fail for battery's over-charging and under-discharging. The over-charging or short circuit can cause the battery temperature to raise and thus damage the battery structure, or finally the battery may explode. When the voltage of the Li-ion battery is increased to 4.30±0.05V during charging, we should immediately stop charging to avoid over-charging or explosion; and when the voltage of the Li-ion battery is decreased to under 2.3±0.1V during discharging, we should immediately stop the discharge, so as not to damage the battery's cycle life.

The supply voltage $V_{BAT}$ between the positive electrode and the negative electrode of the battery is not equal to the battery open circuit voltage $V_{OC}$. This phenomenon can be explained by an internal resistance $R_{INT}$ of the battery in the following equation:

$$V_{BAT} = V_{OC} + I*R_{INT},$$

wherein I is the current passing through the battery.

A typical battery internal resistance $R_{INT}$ is about 100 milli-ohm. Thus, when the charging current I is 1 Ampere and the battery open circuit voltage $V_{OC}$ is 4.1V, the battery supply voltage $V_{BAT}$ is 4.2V. On the other side, when the discharging current I is −1 A and the battery open circuit voltage $V_{OC}$ is 4.1V, the battery supply voltage $V_{BAT}$ is 4.0V.

Therefore, if we did not take the internal resistance R into consideration, we will under-charging the battery or over-discharging the battery. Furthermore, we can not calculate the accurate battery capacity without the internal resistance $R_{INT}$.

Consequently, how to accurately measure the gradually increasing value of the internal resistance $R_{INT}$ after a long period of charging and discharging cycles becomes an essential factor for battery management chip design. However, in some previously published techniques, there are still rooms for improvement on simplicity and precision. For example, Texas Instruments (TI) proposed the patent (U.S. Pat. No. 6,832,171) to estimate the battery capacity and the aging of the battery as follows:

Please refer to FIG. 1, a battery pack 1 includes batteries 10, a battery management system 20, a charge and discharge transistor 40 and a resistor 50. The battery pack provides current to the load 30 (system load) and the current is $I_{LOAD}$. The battery supply voltage between the positive electrode and the negative electrode of the battery is $V_{BAT}$. The current $I_{LOAD}$ passes through the resistor 50 and the current $I_{LOAD}$ can be obtained by measuring the voltage across the resistor 50. With measuring the open circuit voltage $V_{OC}$ of the battery 10, the battery internal resistance DCIR can be calculated as $DCIR=(V_{OC}-V_{BAT})/I_{LOAD}$.

Please refer to FIG. 2. During the discharge, when the depth of discharge (DOD: depth of discharge) is from 0% to 80%, the battery internal resistances are recorded for every 10% DOD changes; when the depth of discharge (DOD: depth of discharge) is from 80% to 100%, the battery internal resistances are recorded for every 3.3% DOD changes, wherein OCV is the open circuit battery voltage and dV is the difference between the open circuit voltage and the battery supply voltage, that is, $V_{OC}-V_{BAT}$.

The battery internal resistance R values are stored in two types table: (1) Ra Table: no temperature correction of the R value, (2) Rb Table: R-value after temperature correction.

This battery internal resistance measurement is based on the system load current $I_{LOAD}$, but system load currents $I_{LOAD}$ are instable and variable on each measurement point. The battery internal resistance data obtained by this method are complex and difficult to be analyzed.

In view of the above issues, the present invention provides a battery capacity measurement by the battery internal resistance of a constant discharge circuit.

SUMMARY OF THE INVENTION

The present invention relates to a battery capacity measurements, and more particularly to the battery capacity measurements by battery internal resistance of a constant discharge circuit.

The object of the present invention is to make use of the battery internal resistance of a constant discharge circuit and to avoid the complexity and errors by using the variable system load current.

First of all, the battery open circuit voltage $V_{OC}$ is measured, and then a discharge path of a constant current $I_{BAT}$ of the battery is established. The battery supply voltage $V_{BAT}$ between the positive electrode and the negative electrode of the battery is then measured when the discharge path of a constant current $I_{BAT}$ in the battery is established. The $V_{OC}$, $I_{BAT}$ and $V_{BAT}$ values are then applied into the following internal resistance formula: $DCIR=(V_{OC}-V_{BAT})/I_{BAT}$. So we can obtain a battery internal resistance DCIR by using a stable and invariable discharge current $I_{BAT}$.

A brand-new lithium battery is fully charged and then the DCIR of the brand-new lithium battery is measured by the above constant current DCIR measurement. This battery is discharged with a constant current to a cut-off voltage and the FCC (Full charge capacity) of this battery can be calculated. The fixed current DCIR and FCC data of this battery are recorded on every fixed number of times of charging and discharging cycles. We can thus establish a table of the fully charged DCIR versus the FCC of the battery. This is the first table.

Next, let's use another brand-new lithium battery which is fully charged. The constant current DCIR of the new lithium battery is measured and the corresponding FCC value of this lithium battery is obtained by looking up the above first table according to the constant current DCIR value. Then, the lithium battery is discharged with fixed currents to decrease 10% of the battery's FCC and the constant current DCIR value is recorded. Thus, in the same way, a set of constant current DCIR values are recorded for every 10% decrease on the battery's FCC until the FCC value decrease to 0% and the battery is discharged to a cut-off voltage, in other words, a set of data of the battery internal resistance DCIR versus corresponding depth of discharge DOD (Depth of Discharge) are recorded. After the battery is fully charged and discharge to cut-off voltage for about 10 times, a second set of data of the battery internal resistance DCIR versus corresponding depth of discharge DOD (Depth of Discharge) are measured and recorded. Thus after several times of charging and discharging cycles on the battery, a third set of data, a fourth set of data . . . are measured in the same way until the battery capacity is in poor condition. The first, second, third . . . set of data are collected to form the second table.

Consequently, for any lithium battery, by looking up the first table, the FCC of the lithium battery can be obtained when the battery is fully charged and the constant current DCIR is measured. By looking up the second table together with the FCC value, the remaining capacity (1-DOD) of the lithium battery can be obtained during battery's discharge if the constant current DCIR is measured.

Accordingly, the object of the present invention is to provide a constant current DCIR measurement. This measurement by a constant current has the characteristic of higher consistence on the internal resistance measurement than by a variable load current. This consistence simplifies the analysis and measurement on the remaining capacity of the lithium battery and the estimation of the degree of battery aging.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 1:
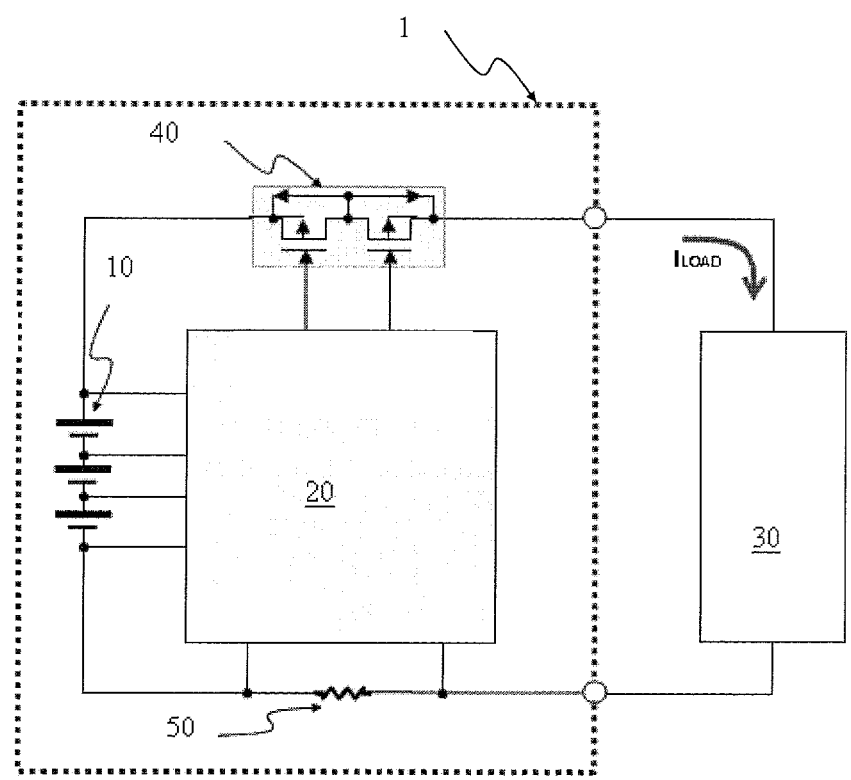
FIG. 1 is a schematic diagram for the internal resistance measurement according to the prior art.
Figure 2:
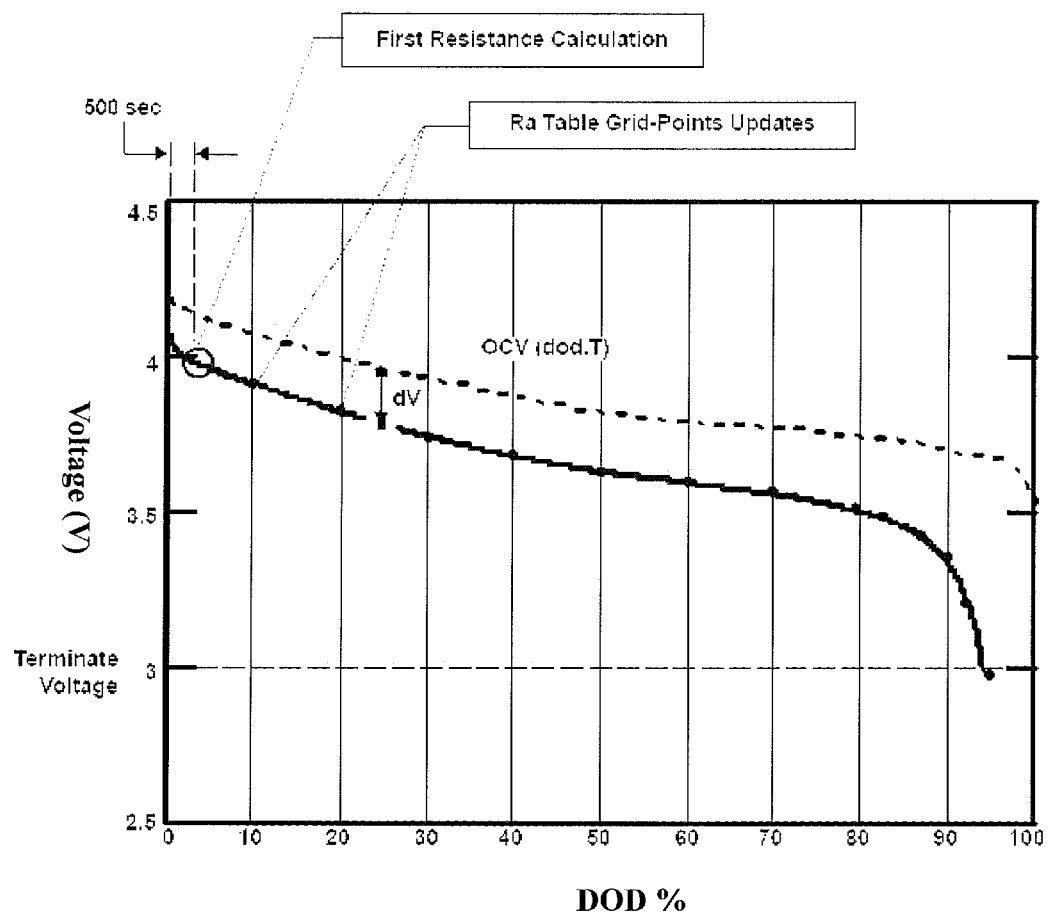
FIG. 2 is a diagram for the internal resistance measurement versus DOD (Depth of Discharge) according to the prior art.
Figure 3:
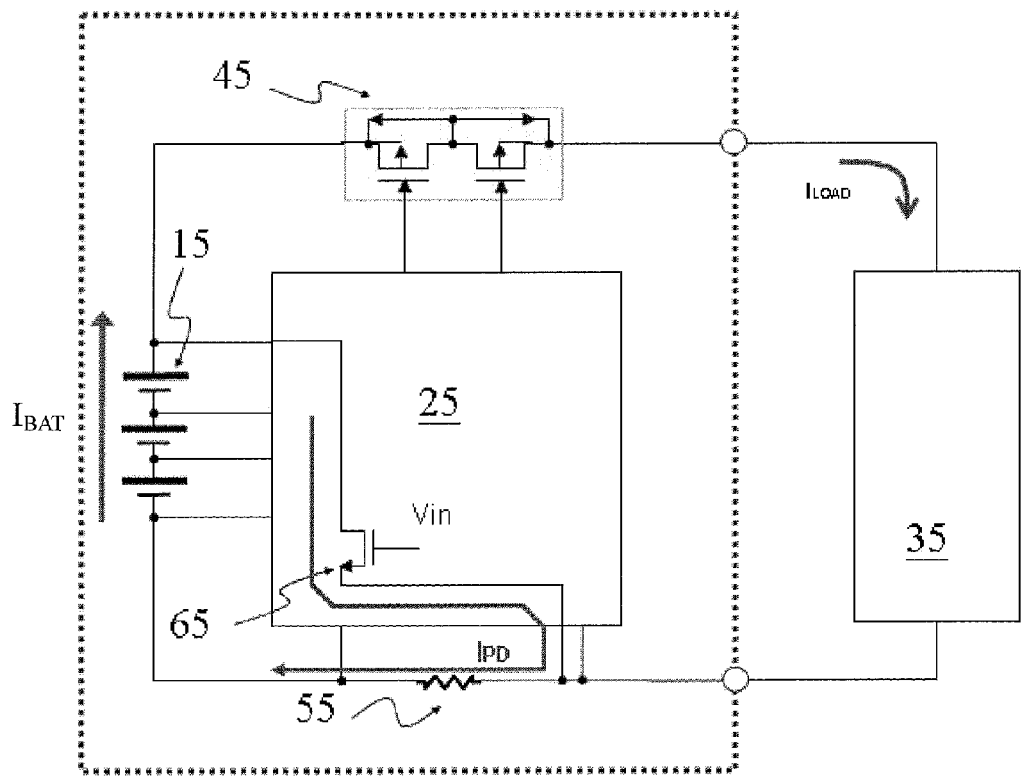
FIG. 3 is a schematic diagram for the constant current DCIR measurement according to a preferred embodiment of the present invention.

Please refer to FIG. 3, a battery pack 1 includes a battery 15, a battery management system 25, a charge and discharge transistors 45 and a resistor 55. Firstly, the open circuit voltage $V_{OC}$ of the battery pack 15 is measured. Then, the current $I_{LOAD}$ of the load 35 is measured by measuring the voltage across the resistor 55. A constant current discharge path of the battery 15 is then established by turning on the transistor 65. One of the electrodes of the battery 15 is connected to one of the electrodes of the transistor 65, another one of the electrodes of the transistor 65 is connected to one electrode of the resistor 55 and the gate electrode of the transistor 65 is connected to a control voltage Vin. Another one electrode of the resistor 55 is connected to the other electrode of the battery 15. In such a way, the discharge path is established and the discharge current of the battery 15 is $I_{BAT}$ which is a constant value $I_{BAT}$ and is controlled by the transistor 65.

Figure 4:
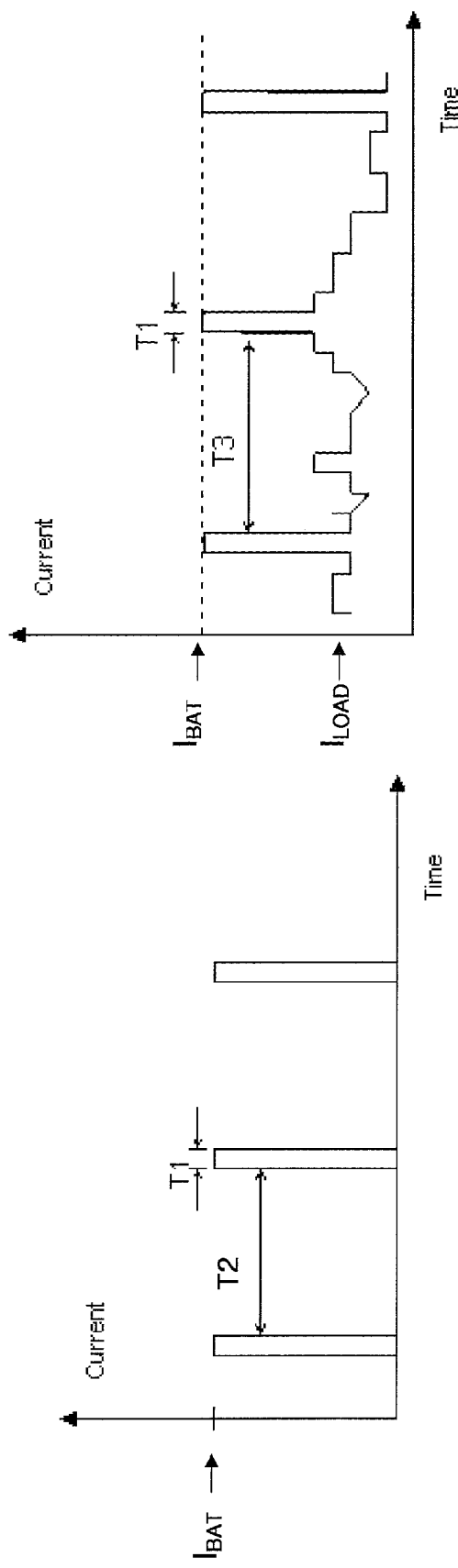
FIG. 4 is a diagram showing the constant current DCIR measurement according to the present invention.

The constant current $I_{BAT}$ can be achieved by controlling the gate voltage Vin which is a pulse voltage. The current which flows through the transistor 65 is $I_{PD}$ and the value of the $I_{PD}$ is controlled by the gate voltage Vin so that battery's current $I_{BAT}$ is a stable constant value as shown in FIG. 4, and the $I_{BAT}$ is a stable value despite the variation of the current $I_{LOAD}$. The voltage $V_{BAT}$ on the two electrodes of the battery 15 is then measured and the $V_{OC}$, $I_{BAT}$ and $V_{BAT}$ values are applied into the following formula $DCIR=(V_{OC}-V_{BAT})/I_{BAT}$ to get a constant current internal resistance DCIR.

Next, a fully charged reference battery A(a brand-new lithium battery) is measured by the above steps to obtain the constant current DCIR, and then the reference battery A is discharged with a constant current $I_{DISC}$ so that the $V_{OC}$ of the reference battery A decreases to a cut-off voltage. The discharge time is $T_{DISC}$ and the current $I_{DISC}$ is multiplied by $T_{DISC}$ to obtain the FCC (Full charge capacity) of the reference battery A, i.e. $FCC=I_{DISC} \times T_{DISC}$.

After the charging and discharging cycles of the battery, the fully charged constant current DCIR and FCC of the reference battery A are measured and recorded. A table including the charging and discharging cycle counts versus the full charged constant current DCIR and FCC of a reference battery is shown in the following table 1. The FCC value is normalized to 10000 when the cycle count is zero.

TABLE 1

| | cycle count | | | | | | | | |
|---|---|---|---|---|---|---|---|---|---|
| | 0 | 10 | 30 | 50 | 100 | 150 | 200 | 300 | 500 |
| DCIR (mOhm) | 100 | 102 | 104 | 107 | 110 | 114 | 119 | 125 | 132 |
| FCC | 10000 | 9980 | 9960 | 9930 | 9900 | 9860 | 9810 | 9750 | 9680 |

Figure 5:
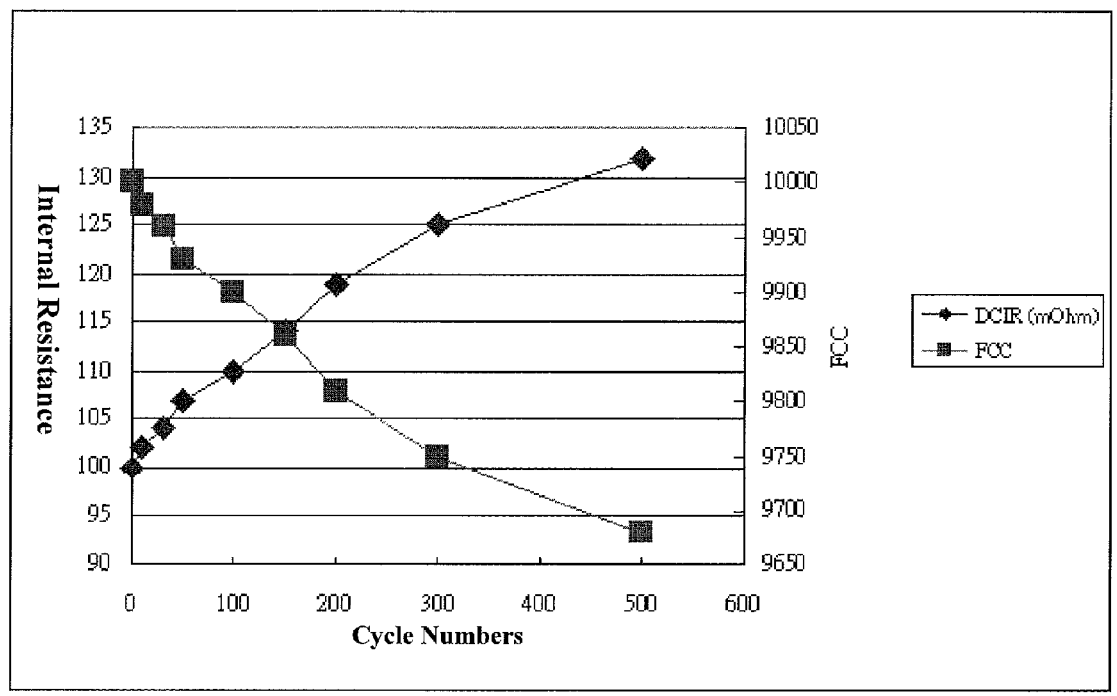
FIG. 5 is a diagram showing the FCC and constant current DCIR versus battery charge and discharge cycle according to the present invention.

The data in table 1 are plotted to be the chart shown in FIG. 5.

The table 1 is used for obtaining the FCC value of any battery C if the battery C is the same as the reference battery A. For example, if the measured fully charged constant current DCIR of a battery D is 110 milli-ohm, the FCC value of the battery D is 9900 by looking up table 1. The battery D is the same as the reference battery A so that the FCC value can obtained by looking up table 1.

Next, the constant current DCIR of a fully charged reference battery B(a brand-new lithium battery) is measured. If the reference battery B is the same as the reference battery A, by looking up table 1, the corresponding FCC value of the reference battery B can be obtained according to the constant current DCIR value of the fully charged reference battery B. Then, the reference battery B is discharged by a constant current, and a plurality of the constant current DCIR values of the reference battery B are measured and recorded for every 10% decrease on the FCC during the discharging of the reference battery B. The reference battery B is discharged to a cut-off voltage(i.e. 0% FCC). The following data 1 show the constant current DCIR values versus DOD (Depth of Discharge) for four different discharge currents of a reference battery. The following data 1 is defined to be the first set of data.

smaller load current, the internal resistance is obtained with larger error. Besides, by the internal resistance formula $DCIR=(V_{OC}-V_{BAT})/I_{LOAD}$, the voltage $(V_{OC}-V_{BAT})$ value will be smaller and thus measured with larger deviation if the $I_{LOAD}$ current is smaller.

For a prefer embodiment of present invention, the current used for internal resistance measurement can be up to 100% to 150% of the battery's rating current. With this larger current for internal resistance measurement, the accuracy is about 4 to 6 times better than with load current. The discharge current used in the present invention for internal resistance measurement is about 4 to 6 ampere for a 4000 mAh battery.

| Data 1 | | | | | | | | | | | |
|---|---|---|---|---|---|---|---|---|---|---|---|
| Discharge | DOD | | | | | | | | | | |
| Current | 0% | 10% | 20% | 30% | 40% | 50% | 60% | 70% | 80% | 90% | 100% |
| 1.5 A | 112 | 108 | 105 | 101 | 97 | 94 | 88 | 85 | 84 | 80 | 83 |
| 2 A | 103 | 100 | 98 | 94 | 92 | 88 | 84 | 82 | 78 | 77 | 80 |
| 3 A | 101 | 99 | 98 | 94 | 92 | 89 | 84 | 82 | 78 | 77 | 79 |
| 5 A | 99 | 98 | 96 | 93 | 91 | 88 | 84 | 82 | 79 | 77 | 79 |

(Unit: mOhm)

Figure 6:
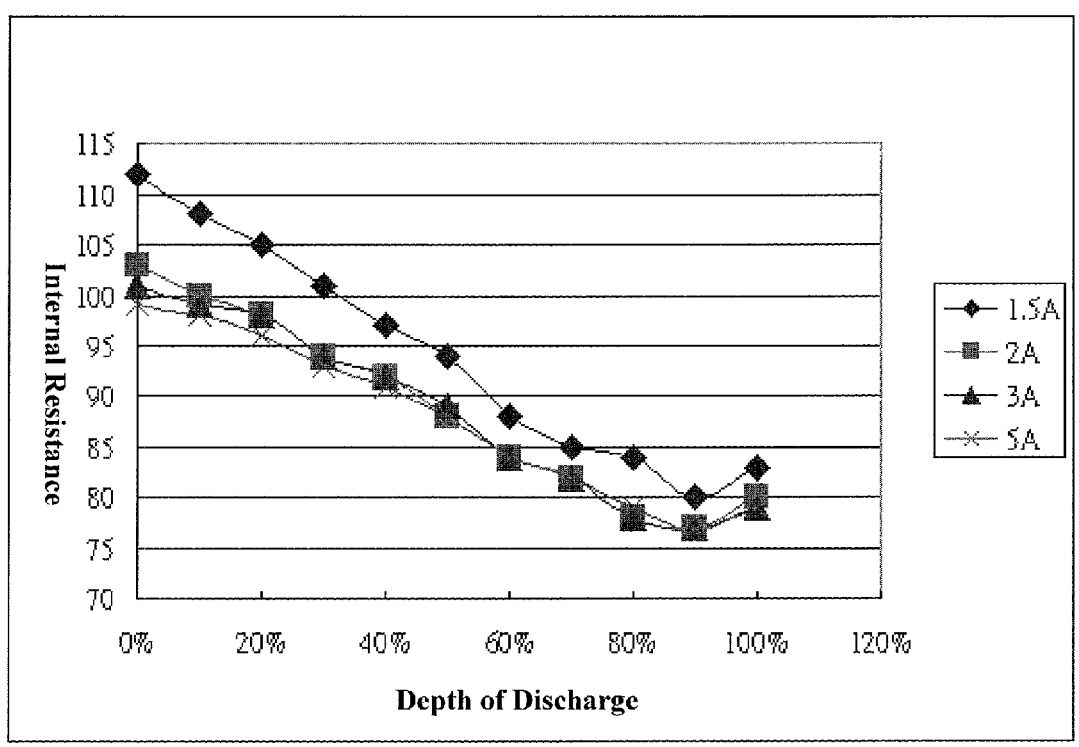
FIG. 6 is a diagram showing the DOD (Depth of Discharge) versus constant current DCIR according to the present invention.

The above first data are also plotted to be the chart shown in FIG. 6.

Next, the reference battery B is fully charged and discharged for 10 times, and then the constant current DCIR measurement is repeated as the measurement of the first data to become a second set of data. So, repeatedly in the same way, a third set of data, a fourth set of data, a fifth set of data, . . . and so on are measured and recorded for every 10 times of fully charging and discharging cycle until the charging and discharging cycle ages the battery into a poor condition. The first set of data, second set of data, third set of data, fourth set of data, fifth set of data, . . . and so on are collected to form a second table.

Thus, by looking up the above first table, the FCC of a battery E can be obtained if the battery E is fully charged and the constant current DCIR is measured. And, by the FCC value and the fully charged constant current DCIR of the battery E, the corresponding set of data in the second table for the fully charged battery E can be obtained.

Next, if the battery E is discharged by a load and then the constant current DCIR value is measured, the remaining capacity of the battery E can be found by looking up the corresponding set of data in the second table according the constant current DCIR value. The remaining capacity value is the FCC value multiplied by the value (1-DOD).

The present invention has the following advantages over prior arts:

1. The internal resistance DCIR of battery is measured by a constant and larger current compared with the variable load current. Consequently, the internal resistance of battery is calculated by a simple calculation rules and consistent measurement conditions.

2. The FCC of the battery can be easily obtained by looking up the first table when the constant current DCIR of a fully charged battery is measured.

3. A more consistent and stable internal resistance is obtained by a larger constant discharge current compared with the variable load current. Usually the current consumption of a consumer electronics products is limited to below 25% of the rating current of a battery. Therefore, by using a 4. The measurement(or discharge) time for the internal resistance measurement of the present invention is controllable, and thus this measurement will not cause the battery to be over-heated or over-discharged. For example, if the discharge time for the measurement of present invention is 0.1 sec, the discharge current is 4000 milliampere and the time interval between measurement is 600 sec, the present invention cost only 0.016% of the battery's capacity.

5. A more accurate DC resistance can be obtained by adjusting the discharge interval according to the habit of usage on the battery.

6. The measured FCC value will be more linear with the internal resistance measured with larger discharge current. Therefore, the internal resistance obtained by the present invention has better linearity with the FCC. And thus it is easier to estimate the remaining capacity and aging of the battery. The algorithm to calculate the remaining capacity and aging of the battery also become easier. With such a better linearity, the internal resistances can be measured only on every 10% of DOD change when the DOD ranges between 0% to 90%.

While the preferred embodiments of the present invention have been set forth for the purpose of disclosure as above, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A remaining capacity measurement method of a battery C in a battery pack including a battery, a battery management system, a charging-discharging transistor, and a resistor, said remaining capacity measurement method, comprising the steps of:
   (a) establishing a first table of Full Charge Capacity (FCC) versus full charged constant current internal resistance DCIR of a reference battery A;
   (b) establishing a second table of DOD (Depth of Discharge) versus full charged constant current internal resistance DCIR of a reference battery B;

(c) charging said battery C fully;

(d) measuring constant current internal resistance DCIR of said fully charged battery C;

(e) obtaining the FCC of said fully charged battery by looking up said first table according to said constant current internal resistance DCIR of said fully charged battery C;

(f) obtaining the corresponding set of data in said second table according to constant current DCIR value of said fully charged battery C;

(g) discharging said battery C;

(h) measuring the constant current internal resistance DCIR of said battery C;

(i) obtaining the DOD of said battery according to constant current internal resistance DCIR of said battery C by looking up said corresponding set of data in said second table; and (j) obtaining the remaining capacity of said battery C by the value FCC multiplied by the value (1-DOD).

2. The remaining capacity measurement method as claimed in claim 1, wherein said establishing a second table comprising the steps of:

(a) providing a reference battery D;

(b) charging said reference battery D fully;

(c) measuring the constant current internal resistance DCIR of said reference battery D;

(d) obtaining the FCC value of said reference battery D by looking up said first table according to the constant current internal resistance DCIR of said reference battery D;

(e) discharging said reference battery D by a constant current to a cut-off voltage, wherein a plurality of the constant current DCIR values of the reference battery D are measured and recorded for every 10% decrease on the FCC during said discharging of the reference battery D;

(f) repeating step (c),(d),(e) and (e) after every second predetermined charge-discharge cycles until a third predetermined charge-discharge cycles, wherein said plurality of the constant current DCIR values of the reference battery D generates a first set of data, a second set of data, a third set of data, a fourth set of data . . . and so on; and (h) collecting said first set of data, second set of data, third set of data, and fourth set of data . . . and so on to be a second table.

3. The remaining capacity measurement method as claimed in claim 2, wherein said establishing a first table comprising the steps of:

(a) providing a reference battery;

(b) charging said reference battery fully;

(c) measuring the constant current internal resistance DCIR of said fully charged reference battery;

(d) discharging said fully charged reference battery to a cut-off voltage by a constant current $I_{BAT1}$ and recording the discharging time $T_{DISC}$;

(e) obtaining and recording the FCC value by the formula $FCC=I_{BAT1} \times T_{DISC}$;

(f) repeating step (b),(c),(d) and (e) for a first predetermined times; and (g) establishing a first table of FCC versus full charged constant current internal resistance DCIR of said reference battery.

4. The remaining capacity measurement method as claimed in claim 3, wherein said measuring the constant current internal resistance DCIR of a battery, comprising the steps of:

(a) measuring the open circuit voltage $V_{OC}$ of said battery;

(b) providing a discharging path by said battery management system, wherein said discharging path is inside said battery management system and the discharge current for said battery is a constant value $I_{BAT}$;

(c) measuring the voltage $V_{BAT}$ between the positive electrode and the negative electrode of said battery; and (d) calculating the internal resistance DCIR value of said battery by applying the $V_{OC}$, $V_{BAT}$ and $I_{BAT}$ values into the following formula $DCIR=(V_{OC}-V_{BAT})/I_{BAT}$.

5. The remaining capacity measurement method as claimed in claim 2, wherein said second predetermined charge-discharge cycles is a number between 1 to 100.

6. The remaining capacity measurement method as claimed in claim 2, wherein said third predetermined charge-discharge cycles is a number between 200 to 2000.

* * * * *